(12) United States Patent
Kohler et al.

(10) Patent No.: US 8,023,348 B2
(45) Date of Patent: Sep. 20, 2011

(54) METHOD AND APPARATUS FOR TESTING A MEMORY DEVICE

(75) Inventors: Ross A. Kohler, Allentown, PA (US); Richard J. McPartland, Nazareth, PA (US); Wayne E. Werner, Coopersburg, PA (US)

(73) Assignee: Agere Systems Inc., Allentown, PA (US)

( * ) Notice: Subject to any disclaimer, the term of this patent is extended or adjusted under 35 U.S.C. 154(b) by 48 days.

(21) Appl. No.: 12/443,776

(22) PCT Filed: Oct. 29, 2007

(86) PCT No.: PCT/US2007/082854
§ 371 (c)(1),
(2), (4) Date: Mar. 31, 2009

(87) PCT Pub. No.: WO2009/058125
PCT Pub. Date: May 7, 2009

(65) Prior Publication Data
US 2010/0182859 A1    Jul. 22, 2010

(51) Int. Cl.
*G11C 29/00* (2006.01)
(52) U.S. Cl. .................................. 365/201; 365/189.05
(58) Field of Classification Search .................. 365/201, 365/189.05
See application file for complete search history.

(56) References Cited

U.S. PATENT DOCUMENTS

| | | | |
|---|---|---|---|
| 4,800,332 A * | 1/1989 | Hutchins | 324/73.1 |
| 5,297,087 A | 3/1994 | Porter | |
| 5,949,726 A * | 9/1999 | Tseng et al. | 365/201 |
| 6,324,108 B1 | 11/2001 | Bill et al. | |
| 6,650,584 B2 * | 11/2003 | Cowles | 365/201 |
| 7,697,355 B2 * | 4/2010 | Kobayashi | 365/201 |
| 2004/0130957 A1 | 7/2004 | LaRosa et al. | |
| 2008/0186785 A1 * | 8/2008 | Jun | 365/201 |
| 2009/0058453 A1 * | 3/2009 | Jinbo | 324/765 |
| 2009/0122594 A1 * | 5/2009 | Kang | 365/149 |

FOREIGN PATENT DOCUMENTS
EP        0987717        3/2000
WO    PCT/US2007/082854    1/2009
* cited by examiner

*Primary Examiner* — Michael Tran
(74) *Attorney, Agent, or Firm* — Ryan, Mason & Lewis, LLP

(57) ABSTRACT

Techniques for testing a semiconductor memory device are provided. The memory device includes a plurality of memory cells and a plurality of row lines and column lines connected to the memory cells for selectively accessing one or more of the memory cells. The method includes the steps of: applying a first voltage to at least a given one of the row lines corresponding to at least a given one of the memory cells to be tested, the first voltage being selected to stress at least one performance characteristic of the memory device, the first voltage being different than a second voltage applied to the given one of the row lines for accessing at least one of the memory cells during normal operation of the memory device; exercising the memory device in accordance with prescribed testing parameters; and identifying whether the memory device is operable within prescribed margins of the testing parameters.

23 Claims, 3 Drawing Sheets

METHOD AND APPARATUS FOR TESTING A MEMORY DEVICE

FIELD OF THE INVENTION

The present invention relates generally to semiconductor memory devices, and more particularly relates to techniques for testing such memory devices.

BACKGROUND OF THE INVENTION

Semiconductor memory devices are subject to defects that may cause some memory cells to be read with incorrect data. For example, in DRAM devices, particularly embedded DRAM (eDRAM), a common defect is a data retention defect, which affects the ability of a memory cell to hold data for a certain minimum period of time. This memory cell with poor data retention is often referred to as a "weak" bit or cell. A data retention defect typically causes the associated bit line to remain near a precharge level when it should be pulled further from precharge (e.g., either towards VDD or ground). A conventional method for testing data retention of a memory cell is to add hold time between writing and reading the cell that is equivalent to or greater than a hold-time specification of the cell during normal operation. Unfortunately, however, this method for testing data retention may add significant time to the testing process, which is undesirably reflected in increased cost of the device.

Weak cells are usually found during hold time or column disturb testing, and can be exacerbated by testing with memory voltage levels (e.g., VDD) at or exceeding logic low and/or logic high specification limits. Weak cells may fail intermittently or fail only with specific patterns in the memory array or only at specific voltages and/or temperatures.

Weak columns typically fail because of imbalances or defects in the columns, precharge devices and/or associated sense amplifiers. Weak columns are generally not attributed to atypical cell leakage characteristics. Charge levels within at least some memory cells along a weak column are typically not sufficient to overcome the imbalances or defects in the precharge devices and/or sense amplifier associated with the column.

Another common failure mechanism affecting memory cells is failure associated with increased cell pass-gate device threshold voltage caused primarily by low temperature. The threshold voltage of the cell pass-gate device increases with decreasing temperature. As is known in the art, increased pass-gate device threshold voltage causes less charge to be written into a cell in one of the two data states (e.g., logic high or logic low). To uncover this type of failure, testing is conventionally done at the lowest specified operating temperature for the device, typically −40 degrees Celsius (° C.) or 0° C. Testing at these temperatures is undesirable because relatively long times are required to reduce and stabilize the temperature of the device under test.

Defects of the type described above are generally discovered during post-manufacture testing of integrated circuit (IC) memory devices and may affect a reliability of the device. Defective memory devices may need to be discarded, thereby reducing the yield of the integrated circuit manufacturing process, and increasing the net manufacturing costs for the non-defective devices.

Accordingly, there exists a need for improved memory testing techniques which do not suffer from one or more of the above-described problems associated with conventional memory testing techniques.

SUMMARY OF THE INVENTION

The present invention, in illustrative embodiments thereof, comprises techniques for efficiently testing memory, particularly DRAM, in an IC. Embodiments of the invention provide a test mode (e.g., built-in self-test (BIST)) operative to selectively adjust a voltage applied to a row line corresponding to at least one selected memory cell in a memory array. This reduces the charge written into a storage capacitor in the memory cell so that leakage-induced data retention failures and column disturb failures will be more easily discovered, to effectively uncover weak cells and weak columns in the memory array, and to effectively uncover pass-gate device high threshold voltage failures by testing at temperatures significantly above a lowest specified operating temperature.

In accordance with one aspect of the invention, a method of testing a semiconductor memory device is provided. The memory device includes a plurality of memory cells and a plurality of row lines and column lines connected to the memory cells for selectively accessing one or more of the memory cells. The method comprises the steps of applying a first voltage to at least a given one of the row lines corresponding to at least a given one of the memory cells to be tested, the first voltage being selected to stress at least one performance characteristic of the memory device, the first voltage being different than a second voltage applied to the given one of the row lines for accessing at least one of the memory cells during normal operation of the memory device; exercising the memory device in accordance with prescribed testing parameters; and identifying whether the memory device is operable within prescribed margins of the testing parameters.

In accordance with another aspect of the invention, a circuit is provided for testing a semiconductor memory device including a plurality of memory cells and a plurality of row lines and column lines connected to the memory cells for selectively accessing one or more of the memory cells. The circuit includes a controller and decoding circuitry connected to the controller. The controller is operative to generate an output voltage for activating a given one of the row lines in the memory device. In a first mode, the controller is operative to selectively adjust a level of the output voltage as a function of at least a first control signal. In a second mode, the output voltage is substantially fixed at a prescribed level for accessing at least one of the memory cells during normal operation of the memory device. The decoding circuitry is operative to receive the output voltage from the controller and to selectively distribute the output voltage to at least a given one of the row lines in the memory device as a function of at least a second control signal.

These and other features, objects and advantages of the present invention will become apparent from the following detailed description of illustrative embodiments thereof, which is to be read in connection with the accompanying drawings.

DETAILED DESCRIPTION OF THE INVENTION

The present invention will be described herein in the context of exemplary methods and apparatus for testing embedded memory in an IC device so as to more effectively identify potentially failing devices, thereby increasing a reliability of passing devices. Moreover, the exemplary testing methods and apparatus described herein can be performed faster compared to conventional testing techniques, thereby decreasing cost. It is to be understood, however, that the techniques of the present invention are not limited to the methods and apparatus shown and described herein.

Illustrative embodiments of the invention provide a test mode (e.g., built-in self-test (BIST)) operative to selectively adjust a voltage applied to a row line corresponding to at least one selected memory cell in a memory array to thereby reduce the charge written into a storage capacitor in the memory cell so that leakage-induced data retention failures and column disturb failures will be more easily discovered, to effectively uncover weak cells and weak columns in the memory array, and to effectively uncover pass-gate device high threshold voltage failures by testing at temperatures significantly above a lowest specified operating temperature.

A "device" as the term is used herein may comprise, by way of example only and without limitation, elements such as those commonly associated with an application-specific integrated circuit (ASIC), single inline memory module (SIMM), dual inline memory module (DIMM), content-addressable memory (CAM), central processing unit (CPU), digital signal processor (DSP), or any other type of data processing or storage device, as well as portions and/or combinations of such elements having embedded memory. A "memory" as the term is used herein is intended to refer broadly to any element that can be employed to at least temporarily store information (e.g., data), typically in binary form although not limited thereto, primarily volatile memory (e.g., DRAM).

Although implementations of the present invention are described herein with specific reference to p-channel metal-oxide-semiconductor (PMOS) and n-channel metal-oxide-semiconductor (NMOS) transistor devices, as may be formed using a complementary metal-oxide-semiconductor (CMOS) fabrication process, it is to be appreciated that the invention is not limited to such transistor devices and/or such a fabrication process, and that other suitable devices, such as, for example, bipolar junction transistors (BJTs), etc., and/or fabrication processes (e.g., bipolar, BiCMOS, etc.), may be similarly employed, as will be understood by those skilled in the art. Moreover, although preferred embodiments of the invention are typically fabricated in a silicon wafer, embodiments of the invention can alternatively be fabricated in wafers comprising other materials, including but not limited to Gallium Arsenide (GaAs), Indium Phosphide (InP), etc.

Figure 1:
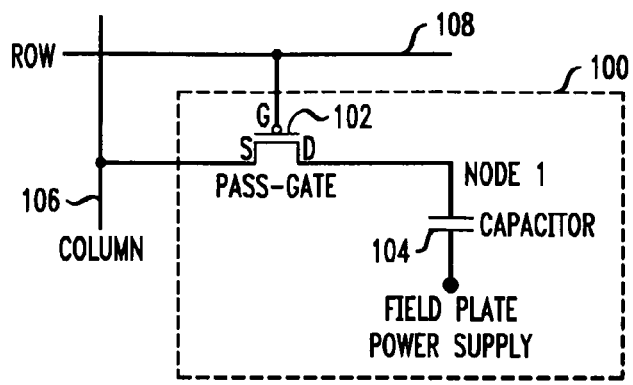
FIG. 1 is a schematic diagram depicting an exemplary memory cell which may be employed in a DRAM array.

FIG. 1 is a schematic diagram depicting at least a portion of an exemplary DRAM cell 100 suitable for use in a memory array comprising a plurality of DRAM cells and a plurality of row lines and column lines for selectively accessing the cells. DRAM cell 100 preferably includes a pass-gate device, which may be implemented as a PMOS transistor 102, operatively coupled to a storage capacitor 104. Specifically, a source (S) of PMOS transistor 102 is connected to a corresponding column line 106, a drain (D) of transistor 102 is connected to a first terminal of storage capacitor 104 at node 1, and a gate (G) of transistor 102 is connected to a corresponding row line 108. A second terminal of storage capacitor 104 may be connected to a field plate power supply, or alternative voltage source (e.g., VSS). Column line 106 and row line 108 represent conductors in a DRAM array (e.g., see FIG. 2) for selectively accessing (e.g., reading and/or writing) the DRAM cell 100, as previously stated.

Although shown as a PMOS transistor 102, the pass-gate device in DRAM cell 100 may alternatively comprise an NMOS transistor device or a combination of PMOS and NMOS devices (e.g., complementary pass-gate). As is known in the art, PMOS transistors are conductive when a logic low level voltage, which may be ground (e.g., zero volts), is applied to their gates. Thus, in order to activate PMOS device 102, and thereby access (e.g., read or write) DRAM cell 100, a voltage difference between the column line 106 and row line 108 at least equal to a threshold voltage, Vt, of the device is applied. When the row line 108 is at a logic high level, PMOS device 102 is non-conductive. Alternatively, NMOS transistors are conductive when a logic high level voltage, which may be voltage supply VDD (e.g., about 3.3 volts), is applied to their gates. When using an NMOS pass-gate device, other bias voltages would be modified accordingly, as will become apparent to those skilled in the art.

Figure 2:
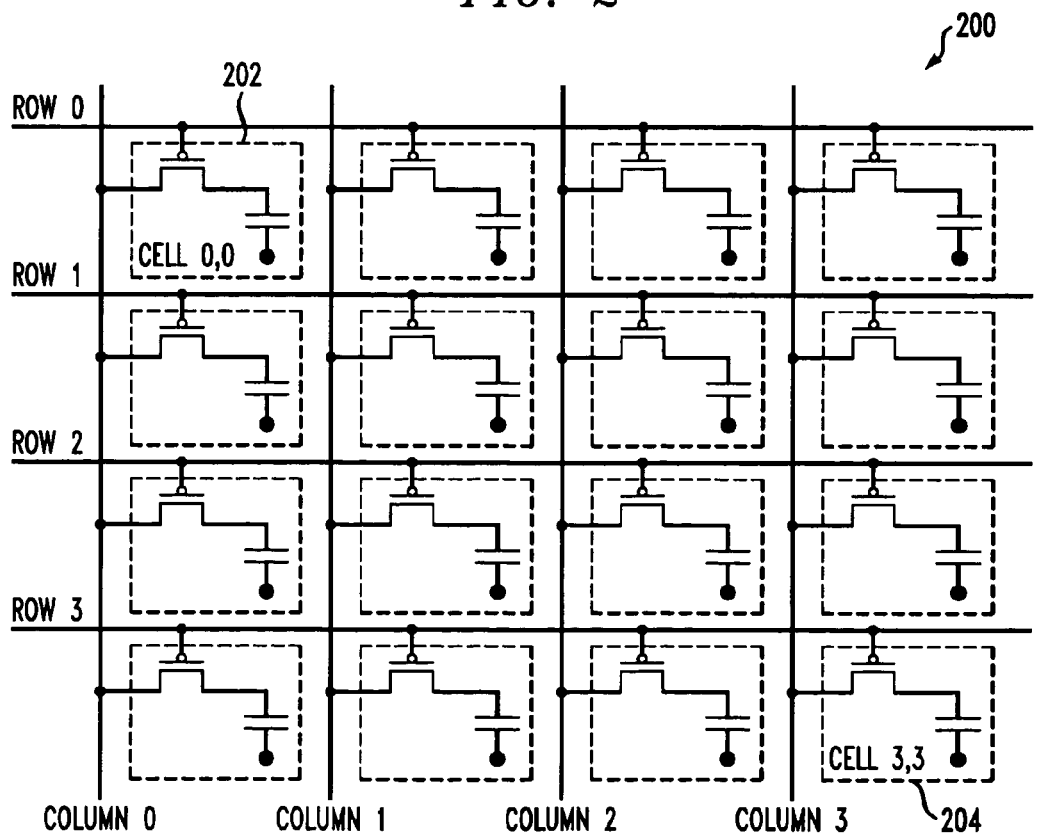
FIG. 2 is a schematic diagram depicting at least a portion of an exemplary memory circuit in which techniques of the invention may be employed.

FIG. 2 is a schematic diagram depicting at least a portion of an exemplary memory circuit 200 in which techniques of the invention may be employed. Memory circuit 200 includes a plurality of DRAM cells, of which cells 202 and 204 are representative, a plurality of column lines, namely, Column 0, Column 1, Column 2 and Column 3, and a plurality of row lines, namely, Row 0, Row 1, Row 2 and Row 3. One or more of the DRAM cells 202 and 204 may be configured as shown in FIG. 1. Preferably, there is a DRAM cell for each unique pair of column and row lines. For example, a corresponding pair of Column 0, Row 0 is connected to Cell 0,0 and is used for selectively accessing Cell 0,0. Likewise, a corresponding pair of Column 3, Row 3 is connected to Cell 3,3 and is used for selectively accessing Cell 3,3. Thus, a given DRAM cell in memory circuit 200 may be referred to as Cell x,y, where x is an integer indicative of the column line to which the given DRAM cell is connected and y is an integer indicative of the row line to which the given DRAM cell is connected. It is to be understood that alternative naming conventions are similarly contemplated.

Although memory circuit 200 is illustrated as a 4×4 array (e.g., four column lines and four row lines), techniques of the invention may be employed with an array of any size N×M, where N is an integer indicative of the number of column lines in the array and M is an integer indicative of the number or row lines in the array. Moreover, although the column lines and row lines in memory circuit 200 are depicted as being substantially perpendicular to one another, with the column lines being arranged in a substantially vertical direction and the row lines being arranged in a substantially horizontal direction, the invention is not limited to any particular orientation of the column lines and row lines.

Figure 3:
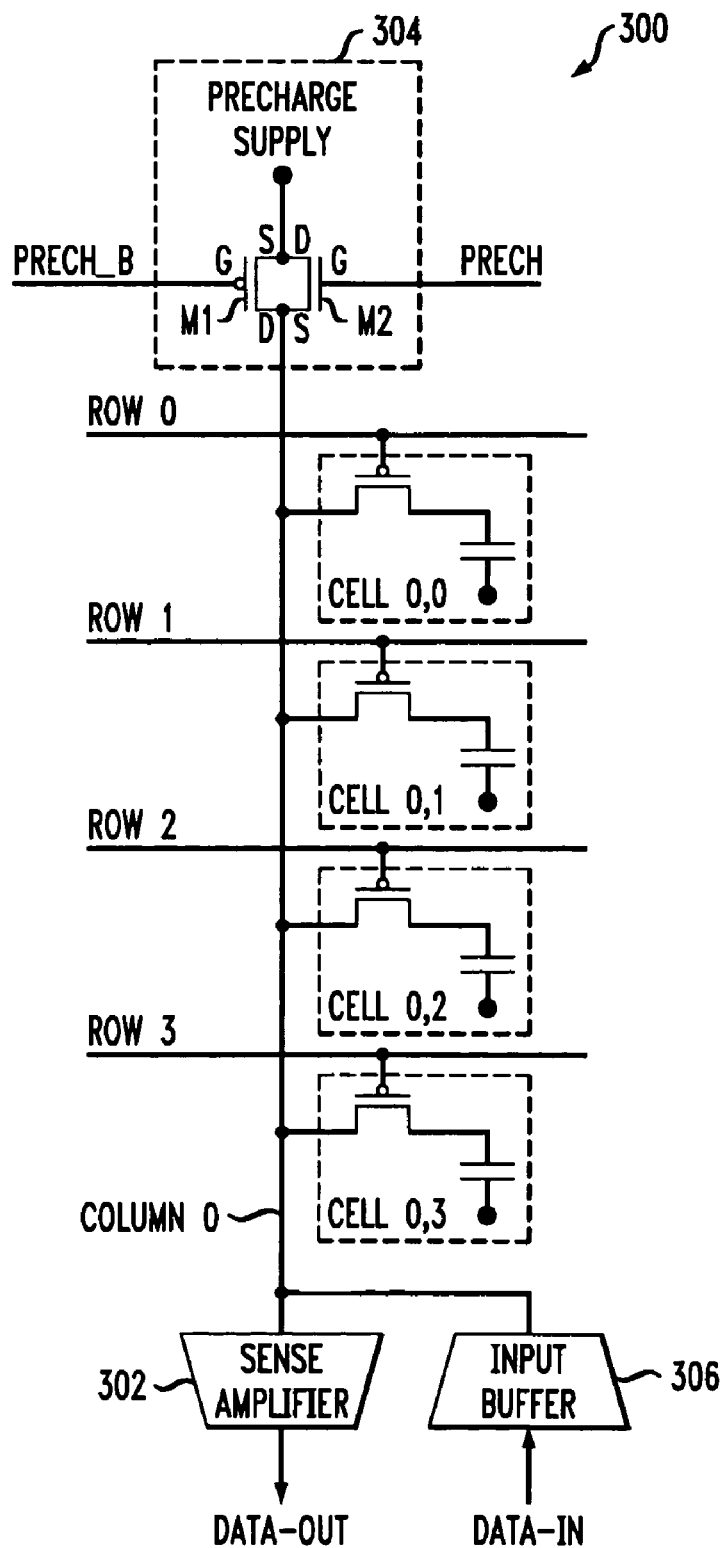
FIG. 3 is a block diagram depicting at least a portion of an exemplary column circuit in which techniques of the invention may be employed.

FIG. 3 is a schematic diagram depicting at least a portion of an exemplary column circuit 300. A plurality of such column circuits may be used to form a larger memory array, an example of which is shown in FIG. 2. As apparent from the figure, column circuit 300 preferably comprises a column line, Column 0. A sense amplifier 302, a precharge circuit 304 and an input buffer 306 are connected to the column line. Every column circuit in the memory array is preferably associated with its own dedicated sense amplifier and precharge circuit, although alternative arrangements are contemplated. Input buffers may be dedicated to specific columns or they may be multiplexed among multiple columns, as is known in the art. The sense amplifier 302 is preferably adapted for reading the logic state of a selected one of the corresponding memory cells (e.g., DRAM cell 0,0) connected to the column line and for generating an output signal, Data-out, indicative of the logic state read from a selected memory cell. The input buffer 306 is preferably adapted to receive an input signal, Data-in, indicative of a logic state to be written into a selected one of the memory cells corresponding to the column line.

Precharge circuit 304 comprises a PMOS transistor device, M1, and an NMOS transistor device, M2, arranged as a complementary pass-gate. Specifically, a source of device M1 and a drain of device M2 are connected to a precharge supply, a drain of M1 and a source of M2 are connected to the column line Column 0, a gate of M1 is adapted to receive a first control signal, Prech_B, and a gate of M2 is adapted to receive a second control signal, Prech, which is a logical complement of the first control signal. Precharge devices M1 and M2 will either both be turned on (e.g., conductive) or both be turned off (e.g., non-conductive). It is to be appreciated that alternative precharge circuitry may be similarly employed. Precharge circuit 304 is preferably adapted to establish a potential on Column 0 of a prescribed voltage level as a function of control signals Prech and Prech_B supplied to the precharge circuit. The precharge voltage level is provided by the precharge supply, which may be generated internally with respect to precharge circuit 304, or supplied externally to the precharge circuit.

Each memory cell, Cell 0,0, Cell 0,1, Cell 0,2 and Cell 0,3, connected to a given column line, Column 0, is also connected to a corresponding row line, Row 0, Row 1, Row 2 and Row 3, respectively. Each row line in a memory array typically includes a plurality of memory cells connected thereto, although only a single memory cell is shown connected to a given row line.

There are typically four primary modes of operation, also referred to herein as states, associated with a DRAM array, namely, precharge, refresh, read and write. Precharge occurs during an inactive portion of a memory cycle. Refresh, read and write occur during an active portion of the memory cycle. Table 1 below shows exemplary voltage potentials and conditions associated with each of the identified modes of operation.

TABLE 1

| Mode | Column Voltage | Row Voltage | Node 1 Voltage (FIG. 1) | Precharge devices M1 and M2 (FIG. 3) |
|---|---|---|---|---|
| Precharge | VDD/2 | VDD (row deactivated) | low or VDD | Conductive |
| Refresh "low" | Goes from VDD/2 to 0 | 0 (row active) | low | Non-conductive |
| Refresh "high" | Goes from VDD/2 to VDD | 0 (row active) | VDD | Non-conductive |
| Read "low" | Goes from VDD/2 to 0 | 0 (row active) | low | Non-conductive |
| Read "high" | Goes from VDD/2 to VDD | 0 (row active) | VDD | Non-conductive |
| Write "low" | Goes from VDD/2 to 0 | 0 (row active) | low | Non-conductive |
| Write "high" | Goes from VDD/2 to VDD | 0 (row active) | VDD | Non-conductive |

A brief description of each of the primary operational modes will now be provided. With reference to FIG. 3, during precharge, the column line Column 0 is preferably driven, via precharge circuit 304, to the voltage level of the precharge supply by enabling conduction through one or both precharge devices, M1 and M2. A typical precharge supply voltage is VDD/2, although the invention is not limited to any particular precharge voltage level.

The objective of a refresh operation is to restore charge back into a DRAM cell storage capacitor 104 (FIG. 1) which may have previously leaked from the cell, typically due to pass-gate, dielectric and/or junction leakage (e.g., capacitor and/or pass-gate). During refresh, the output signal, Data-out, from the sense amplifier is not monitored. Refresh may occur, for example, by activating a row line (e.g., logic low potential) so that all pass-gate devices along that row line are conductive. Charge from the memory cell storage capacitor 104 is transferred through the active pass-gate device 102 onto its corresponding column line 106, either lowering or raising the column line voltage by a small amount. If the potential stored in the memory cell was indicative of a logic high state, then positive charge is transferred onto the column line, thereby raising its potential. Likewise, if the potential stored in the memory cell was indicative of a logic low state, then negative charge is transferred onto the column line, thereby lowering its potential.

Memory cell capacitance is typically much smaller than the parasitic column line capacitance. Consequently, the change in column voltage resulting from the transferred charge, which is a function of a ratio between the parasitic column line capacitance and the storage cell capacitance, is typically small. The sense amplifier 302 (FIG. 3) is operative to sense this small voltage change on the column line and its direction then drives the column line potential much further than the voltage change due to charge sharing with the memory cell. Depending upon the state of the data being read, the sense amplifier typically drives the column line voltage to VDD or zero volts, indicative of a logic high or a logic low, respectively. When charge sharing occurs from the memory cell to the column line, the cell loses much of its stored charge thereby destroying the information in the cell. In order to restore the memory cell with charge corresponding to the correct data state, charge from the column line, driven to VDD or zero volts by the sense amplifier, is transferred from the column line to the cell through the pass-gate device in the cell. During refresh, as well as during read and write operations, devices M1 and M2 are typically non-conductive.

A read operation is very similar to a refresh operation except that the data-out from one or more of the sense amplifiers in the memory array is monitored. Read data usually comprises the respective output signals from sense amplifiers corresponding to a group of addressed memory cells referred to as a word.

A write operation typically involves writing data, supplied externally (e.g., Data-in), into an addressed word of memory cells. During a write operation, a selected row line is activated (e.g., by application of a logic low potential to the row line), data (e.g., Data-in) is presented to an input of the input buffer 306, and precharge devices M1 and M2 in precharge circuit 304 are nonconductive (see FIG. 3). Depending on the state of the input data, the input buffer will force a high or low potential, typically VDD or zero volts, onto the corresponding column line (e.g., Column 0). The high or low column potential goes through the pass-gate device and transfers the corresponding charge into the storage capacitor associated with the selected memory cell for data storage. Typically, not all column lines in a memory array will have activated input buffers concurrently. Those memory cells connected to an activated row line with column lines driven by active input buffers will be written. Memory cells connected to the same row line, but without activated input buffers, will be refreshed as described above.

There are typically many memory cells connected to a given column line. However, only one memory cell associated with the given column line will be active at any time during the active portion of the memory cycle. Memory cells are selected by activating their respective corresponding row lines. In the case of the illustrative DRAM cell 100 shown in FIG. 1, this may be accomplished by applying a logic low level signal (e.g., zero volt) to the row line corresponding to the selected DRAM cell. All cells along an active row line will also be active. All of the other row lines in the memory array are inactive (i.e., deselected), thereby keeping all of the memory cells connected to those inactive row lines isolated from their respective column lines.

As previously stated, semiconductor memory devices are subjected to defects that may cause some memory cells to be read with incorrect data. In order to identify such defects, various testing methodologies have been proposed. Unfortunately, conventional memory testing approaches are undesirable in that such testing approaches either significantly reduce test throughput, and are thereby costly, or fail to successfully uncover certain defects, thereby impacting device reliability. A description of some standard testing objectives are presented herein below.

Testing usually refers to tests performed during production of the IC, for example, using automated test equipment (ATE), after manufacture and before shipment to a customer. However, the term "testing" as used herein is intended to broadly encompass other means of identifying failures in an IC. For instance, testing may refer to built-in-self-testing (BIST) which may be initiated on command within the IC itself as part of a test mode or otherwise. Testing may also refer to tests performed by the customer on receipt of the IC or after the IC has been in operation for some period of time. Testing can also refer to tests performed, for example, during failure mode analysis (FMA).

With reference again to FIG. 1, ideally, the potential on Node 1 of DRAM cell 100 will be retained essentially indefinitely. In reality, however, this voltage potential will decay over time as stored charge leaks through pass-gate device 102, through a dielectric material of storage capacitor 104, through a PN junction associated with the pass-gate device and/or the capacitor, or through some other leakage path, such as, for example, cell-to-cell isolation. Accordingly, DRAM cells must be periodically refreshed; that is, each cell is read and re-written with its read data to restore full potential to Node 1. A typical refresh interval, also referred to as a refresh rate, for DRAM is between about 10 microseconds (μs) and 1000 μs.

With regard to DRAM testing, a data retention test checks for voltage retention on Node 1 of DRAM cell 100. More particularly, data retention tests are designed to ensure that the potential on Node 1 does not leak off to the extent that the state of the cell becomes non-discernable during the refresh interval. Data retention tests will first write known data to one or more DRAM cells being tested, then wait an amount of time equivalent to or longer than a specified refresh interval (e.g., hold time), and then read the cells, checking for valid data. Such data retention tests will preferably set memory cells, column lines and neighboring memory cells at potentials that maximize all the components of leakage while reflecting anticipated worst case potentials. Some or all components of leakage may require different potential sets to maximize their leakage. Therefore, data retention testing may involve a series of tests designed for different leakage components.

Overall data retention test time generally reflects multiple components, including, for example, write time, hold time and read time. Hold time is usually significantly longer than the other components. Furthermore, there are other considerations such as voltage, temperature, disturbs and the electrical noise environment that may require data retention tests to be repeated multiple times.

Column disturbs are a particular component affecting data retention. DRAM memory cells, and in particular eDRAM memory cells made in a logic process, are susceptible to leakage through the pass-gate device to the corresponding column line. When a DRAM cell has been written to a logic low data state, a low voltage potential (e.g., typically zero to about 0.3 volts) has been stored on Node 1 of the storage capacitor associated with the cell. When a cell has been written to a logic high data state, a high voltage potential (e.g., typically VDD) has been stored on Node 1 of the capacitor. The potential on the corresponding column line during the precharge phase is typically fixed at some voltage level between zero volts and VDD, preferably VDD/2. When a selected memory cell connected to a given column line is being written, the column potential is either at a low potential (e.g., typically zero volts), if the cell is being written to a logic low state, or at a high potential (e.g., typically VDD), if the cell is being written to a logic high state. When a cell is being read and refreshed, the column potential goes to a low level when reading a low state, or to a high level when reading a high data state.

Pass-gate device leakage is generally greatest when the potential difference across the pass-gate device is greatest; that is, when the potential difference between the column line and Node 1 of the DRAM cell is greatest. Furthermore, leakage is typically greatest when a memory cell connected to a given column line is being written, read or refreshed to a state that is opposite that of another memory cell connected to the same column line. One reason for this is because the column line potential will be opposite the potential on Node 1 of the memory cell of concern (e.g., VDD vs. 0 volts, or 0 volts vs. VDD). Because there may be many memory cells connected to a given column line, all but one memory cell being in the same data state represents a particularly stressful condition with regard to the one memory cell being in the minority data state.

Compared to a memory cell storing data opposite to the data stored in the selected memory cell being accessed (e.g., written, read or refreshed), the leakage through the pass-gate device is typically less during precharge than during the active portion of the memory cycle. This is because the potential across the pass-gate device during precharge is typically VDD/2, independent of the state of the selected memory cell. That is, the potential across any pass-gate device in a memory cell during the inactive portion of the memory cycle will be VDD/2 or less, whereas during an active portion of the memory cycle, the potential across the pass-gate device in the selected memory cell compared with a cell storing opposite data will be VDD or close to VDD.

Column disturb tests may be considered a subset of data retention tests adapted to check leakage through the pass-gate device in a given memory cell. Such column disturb tests preferably involve: writing the memory in such a way that a given column line will be biased to an opposite data state relative to a data state of a selected memory cell connected to the given column line; waiting a prescribed time interval substantially equivalent to a stress interval between refresh operations during normal operation (e.g., dwell time); and reading the given memory cell to verify that the data stored therein is valid.

By way of example only, consider a column disturb test which includes the steps of: writing the entire memory array to a first data state; writing a selected row line in the memory array to an opposite (minority) data state; continuously refreshing and/or reading memory cells connected to row lines other than the selected row line written to the minority data state for a time interval equivalent to or longer than a prescribed maximum allowed refresh interval for the memory array; and reading the memory array, checking at least the data state of memory cells connected to the row line written to the minority data state.

Column disturb tests are preferably performed in conjunction with other data retention tests to ensure that memory cells are stressed to a worst case leakage environment. Typically, such tests are done at various combinations of voltage and/or temperature limits specified for the memory array.

Because test time on modern automated testing equipment (ATE) is costly and because longer test time reduces the number of devices that can be tested per unit time, a measure of test throughput, it is desirable to reduce test time to a minimum to thereby reduce cost associated with memory testing. It is therefore desirable to have data retention and column disturb tests provide maximum worst case stress for leakage while minimizing the time duration needed to perform these tests. It is also beneficial to eliminate the need for testing at temperatures significantly below room temperature (e.g., −40 degrees Celsius) due to the relatively long soak time needed to lower and stabilize the device temperature. Thus, it is desirable to provide a memory testing methodology operative to uncover pass-gate device high threshold failures that does not require testing below room temperature. Weak memory cells and weak columns in a memory array are sometimes difficult to uncover using standard testing methodologies, in part because the memory array may pass standard tests within a prescribed voltage and/or temperature range, but subsequently fail in the field under some specific set of conditions. It is therefore desirable to perform testing on the memory array in a manner that effectively uncovers weak memory cells and weak columns.

In DRAM cell 100 shown in FIG. 1, ideally a full column logic high voltage level, typically VDD (e.g., 1.0 volt), is written into the storage capacitor 104. Immediately after writing, before any charge loss, the voltage on Node 1 is substantially equal to VDD. The logic low level that can be written into the storage capacitor 104 is limited primarily by the potential on row line 108 and on the threshold voltage Vt of the pass-gate device 102. Immediately after writing, before any charge loss, the potential on Node 1 will substantially be the higher of the voltage potential applied to column line 106 and the voltage potential applied to row line 108 plus the magnitude of the pass-gate device threshold voltage, |V|. Table 2 below shows some exemplary voltage levels at Node 1 when writing a logic low level into storage capacitor 104.

TABLE 2

| Column Voltage | Row Voltage (activated) | Pass-gate Threshold Voltage, Vt (magnitude) | Row Voltage + \|Vt\| | Node 1 Voltage (low level) |
|---|---|---|---|---|
| 0 | 0 | 0.3 | 0.3 | 0.3 |
| 0 | −0.5 | 0.3 | −0.2 | 0 |
| −0.4 | −0.5 | 0.3 | −0.2 | −0.2 |

Four primary current leakage paths in the memory cell 100 which can remove charge from the storage capacitor 104 include: (i) through the pass-gate device 102; (ii) through a dielectric of the storage capacitor; (iii) through a PN junction associated with a source/drain region of the pass-gate device; and (iv) if the storage capacitor is an MOS capacitor, through a PN junction associated with a source/drain region of the storage capacitor. These leakage paths are summarized in Table 3 below.

TABLE 3

| Leakage Path | Node 1 Leaks Towards . . . | Typical Voltage Potentials at Node 1 |
|---|---|---|
| Pass-gate device | Column line potential | VDD/2 during precharge; Zero when reading a low state; VDD when reading a high state |
| Capacitor dielectric | Field plate power supply | Zero or lower for PMOS capacitor; VDD/2 for other than MOS capacitor; VDD or higher for NMOS capacitor |
| PN junction (pass-gate device source/drain) | Well potential | VDD for PMOS pass-gate device; Zero for NMOS pass-gate device |
| PN junction (capacitor source/drain) | Well potential | VDD for PMOS (N-well) capacitor; Zero for NMOS (P-well) capacitor; no leakage if other than MOS capacitor |

As apparent from Table 3, Node 1 has leakage components that pull its potential toward either VDD or zero volts, depending on the type of storage capacitor employed (e.g., MOS or above silicon) and on the operating mode of the memory cell (e.g., precharge, read, etc.), among other characteristics.

During a standard write of a logic low data state into a selected memory cell, the corresponding row line is set to some fixed voltage level. For memory cells using PMOS pass-gate devices, the row voltage applied is typically zero volts or less (see Table 2). The charge written into the memory cell is proportional to the voltage at Node 1, also shown in Table 2.

In accordance with embodiments of the invention, the level of the voltage applied to the row line corresponding to a selected memory cell is selectively controlled so as to stress one or more failure mechanisms in the cell (e.g., data retention, weak cell, etc.), as will be described in further detail below. The row voltage level applied may be a function of the type of memory test performed. Hence, the row voltage will not necessarily be restricted to logic high and logic low voltage levels (e.g., VDD and zero volts, respectively), but instead may take on other values, including, for example, VDD, zero, or any values therebetween, in accordance with aspects of the invention. The potential applied to the row lines during stress testing of a memory device will be different (e.g., greater or less, depending on the particular performance characteristic being tested) than the potential applied to the row lines during normal operation (e.g., read, write, or refresh) of the device.

Figure 4:
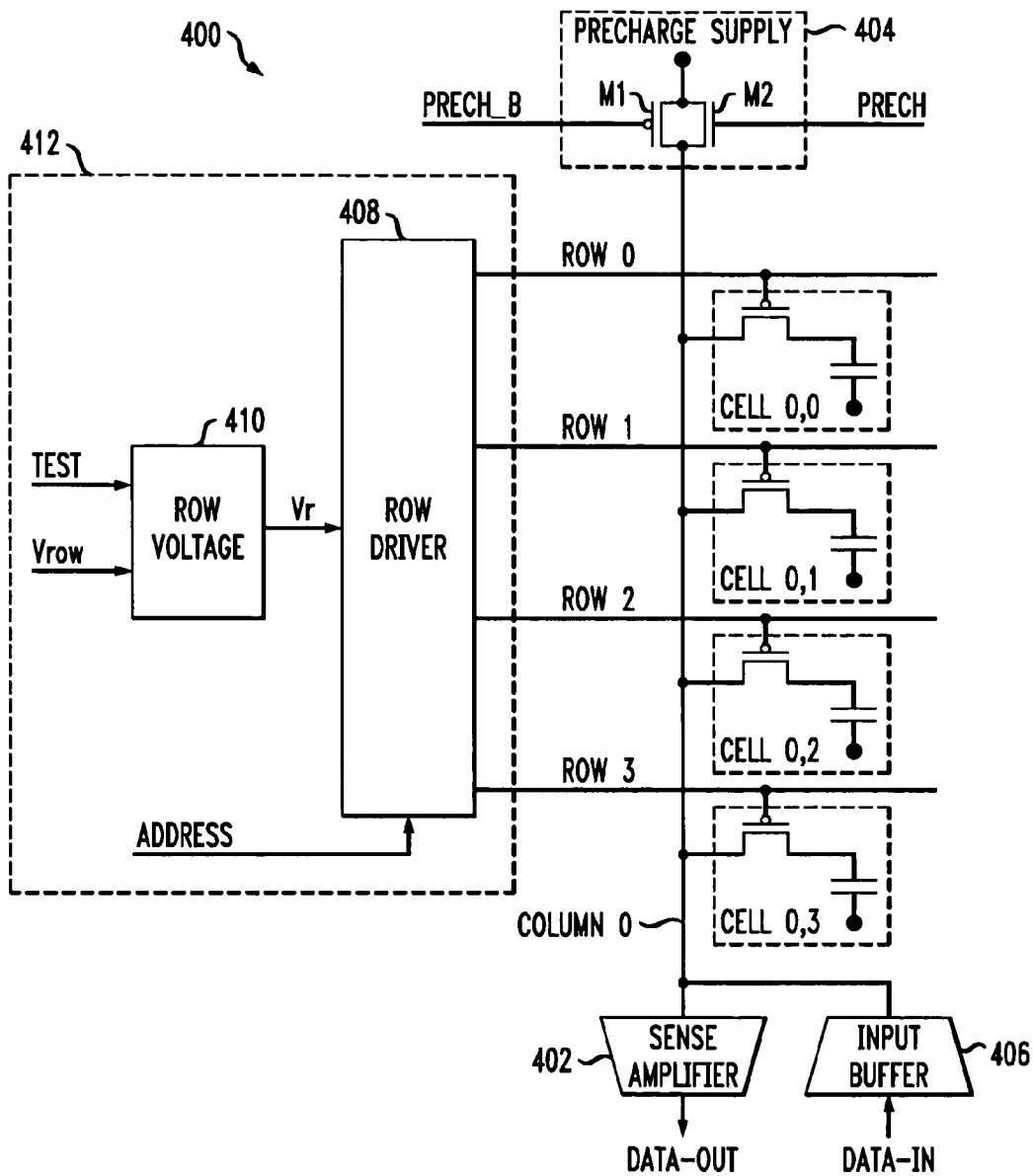
FIG. 4 is a schematic diagram depicting at least a portion of an exemplary column circuit, formed in accordance with an embodiment of the invention.

FIG. 4 is a schematic diagram depicting at least a portion of an exemplary column circuit 400, formed in accordance with an embodiment of the invention. A plurality of such column circuits may be used to form a larger memory array, an example of which is shown in FIG. 2. As apparent from the figure, column circuit 400 preferably comprises a column line, Column 0. A sense amplifier 402, a precharge circuit 404 and an input buffer 406 are connected to the column line. Every column circuit in the memory array is preferably associated with its own dedicated sense amplifier and precharge circuit, although the invention is not limited to such an arrangement. Input buffers may be dedicated to specific columns or, alternatively, they may be shared (e.g., multiplexed) among multiple columns. The sense amplifier 402 is preferably adapted for reading the logic state of a selected one of the corresponding memory cells (e.g., DRAM cell 0,0) connected to the column line and for generating an output signal, Data-out, indicative of the logic state read from the selected cell. The input buffer 406 is preferably adapted to receive an input signal, Data-in, indicative of a logic state to be written into a selected one of the memory cells connected to the column line.

Precharge circuit 404 preferably comprises a PMOS transistor device, M1, and an NMOS transistor device, M2, arranged as a complementary pass-gate. Specifically, a source of device M1 and a drain of device M2 are connected to a precharge supply adapted to generate a precharge voltage (e.g., VDD/2), a drain of M1 and a source of M2 are connected to the column line Column 0, a gate of M1 is adapted to receive a first control signal, Prech_B, and a gate of M2 is adapted to receive a second control signal, Prech, which is a logical complement of the first control signal. Alternative precharge circuitry is similarly contemplated by the invention. Precharge devices M1 and M2 will either both be turned on (e.g., conductive) or both be turned off (e.g., nonconductive). Precharge circuit 404 is preferably adapted to establish a potential on Column 0 of a prescribed voltage level as a function of control signals Prech and Prech_B supplied to the precharge circuit. As stated above, the precharge voltage level is provided by the precharge supply, which may be generated internally with respect to precharge circuit 404, or supplied externally to the precharge circuit.

Each memory cell, Cell 0,0, Cell 0,1, Cell 0,2 and Cell 0,3, connected to a given column line, Column 0, is also connected to a corresponding row line, Row 0, Row 1, Row 2 and Row 3, respectively. Each row line in a memory array typically includes a plurality of memory cells connected thereto, although only a single memory cell is shown connected to a given row line.

Each of the row lines is preferably connected to a row driver 408 in the memory array. Row driver 408 may comprise a multiplexer, or alternative decoding circuitry, having an input operative to receive the row voltage, Vr, and having a plurality of outputs for distributing the row voltage to a selected one of the row lines as a function of a control signal, ADDRESS, supplied to a control input of the row driver. Depending on the number of outputs associated with row driver 408, the control signal ADDRESS may actually be comprised of a plurality of signals, much like a bus, as will be appreciated by those skilled in the art.

The row voltage Vr is preferably supplied by a row voltage generator 410 connected to the row driver 408. Optionally, row driver 408 and row voltage generator 410 may be incorporated into a same circuit block 412 in column circuit 400. Row voltage generator 410 preferably comprises a programmable voltage source, or alternative controller (e.g., multiplexer), which in a first mode is operative to selectively control a level of the row voltage Vr as a function of a control signal, TEST, supplied to the row voltage generator. In a second mode of operation, the row voltage generator 410 is preferably operative to generate a row voltage Vr which is substantially equal to a fixed voltage, Vrow, received by the row voltage generator. The first mode may be, for example, a test mode (e.g., BIST) of the memory array, while the second mode may be a normal (e.g., standard) mode of operation of the memory array. The voltage Vrow, which is equivalent to the standard (e.g., unadjusted) voltage to be applied to one or more row lines for activating the one or more row lines during normal operation of the memory device, may be generated by a voltage source internal to the row voltage generator 410. Alternatively, voltage Vrow may be supplied to the row voltage generator from an external voltage source.

During testing (e.g., test mode), write operations will be referred to as margin writes. To perform a margin write, the voltage applied to the corresponding row of a selected memory cell for writing the cell to a logic low level data state is set higher than a prescribed voltage which would otherwise be applied to the row during a standard write so that less charge will be written into the cell as reflected by a higher potential on Node 1. Table 4 shows typical comparisons between a standard write and a margin write, including exemplary row and Node 1 voltages. It is to be understood that the invention is not limited to the voltage levels shown. As depicted in Table 4, margin read row voltages have been set to write cells with low levels that have Node 1 potentials that are about 0.2 volts higher that that for a comparable standard write.

TABLE 4

| Write Type | Column Voltage | Row Voltage (activated) | Pass-gate Threshold Voltage, Vt (magnitude) | Row Voltage + \|Vt\| | Node 1 Voltage (low level) |
|---|---|---|---|---|---|
| Standard | 0 | 0 | 0.3 | 0.3 | 0.3 |
| Margin | 0 | 0.2 | 0.3 | 0.5 | 0.5 |
| Standard | 0 | −0.5 | 0.3 | −0.2 | 0.0 |
| Margin | 0 | −0.1 | 0.3 | 0.2 | 0.2 |
| Standard | −0.4 | −0.5 | 0.3 | −0.2 | −0.2 |
| Margin | −0.4 | −0.3 | 0.3 | 0.0 | −0.0 |

The voltage levels at Node 1 shown in Table 4 are achieved based primarily on the assumption that the write time is of sufficient duration for equilibrium to be reached for charge transferred from the column line corresponding the selected memory cell, through the pass-gate device and onto Node 1 of the storage capacitor in the cell. When this assumption is not valid (e.g., when the write time is not sufficient for equilibrium to be reached), both standard and margin write potentials on Node 1 will be shifted (e.g., increased), preferably in substantially equal proportions relative to one another, by some amount. The amount by which the potentials on Node 1 are shifted may be indicative of, for example, a difference between potentials on Node 1 when equilibrium is reached compared to when equilibrium is not reached.

During a standard write of a logic high level into a selected memory cell, the full column line high potential (e.g., VDD) is written onto Node 1 of the storage capacitor in the cell, assuming the write time is of sufficient duration for charge transfer to reach equilibrium. Typically, a memory may be designed so that equilibrium is substantially reached before the write operation is terminated. To margin write a logic high level data state into the selected memory cell, the row voltage corresponding to the cell is raised from its standard write voltage. For example, instead of 0 volts, the voltage applied to the corresponding row line may be increased to about 0.3 volts. The effect is to increase the time it takes for charge to transfer from the corresponding column line, through the pass-gate device and onto Node 1. That is, it takes longer to reach equilibrium. When the margin write is terminated before equilibrium is reached, the voltage on Node 1 will be less than in the standard write case; therefore, charge transferred to the storage capacitor in the selected memory cell will be less. The row voltage can be adjusted sufficiently high to write the desired smaller amount of charge onto the memory cell storage capacitor to create a desired amount of margin.

Data Retention Margin Testing

Data retention margin testing can be performed using the adjusted row voltage to reduce the amount of charge stored in the cells by some small amount when compared to that of a normal write. It will then take less time for leakage to reduce the amount of stored charge to the point where reading results in failure. For example, in accordance with an embodiment of the invention, data retention for margin testing may involve storing a voltage indicative of a logic high state in a given memory cell to be tested, and then reading the state of the memory cell after a first period of time to determine whether the voltage stored in the given memory cell is at least equal to a specified minimum level indicative of a logic high state. The first period of time, which may be a function of the amount of reduction in charge stored in the cells compared to that of a normal write, is preferably less than a minimum specified data retention period corresponding to the memory device. This results in reduced test time and lower test costs.

Column Disturb Testing

Column disturb tests can be preformed in accordance with an embodiment of the invention using the adjusted row write voltage to reduce the amount of charge stored in the cells by some small amount when compared to that of a normal write. It will then take less time for column disturb leakage through the pass-gate device to reduce the amount of stored charge to the point where reading results in failure. This results in reduced test time and lower test costs.

Another method of column disturb testing with adjusted row voltage is to reduce a voltage, also referred to as a deselected row voltage, applied to one or more row lines for turning off the pass-gate devices associated with memory cells which are not selected for access. Reducing the deselected row voltage during reading will cause the pass-gate devices in the respective memory cells to leak slightly more than they would with full row voltage. Normally, the row voltage for the deselected row lines may be VDD, assuming PMOS pass-gate devices are employed. As an example, to increase pass-gate device leakage by a small amount, the deselected row voltage may be reduced by up to a few tenths of a volt (e.g., about VDD−0.2). Although the pass-gate devices are still in the nonconductive state, their sub-threshold, or off-state, leakage will increase. This is a good method for identifying pass-gate devices in the array of memory cells that have the highest leakage current and therefore correspond to cells that are most susceptible to column disturb failures. If NMOS pass-gate devices are used rather than PMOS devices, a slightly increased deselected row voltage (e.g., about 0.2 volt) would be applied to the row lines not connected to a selected memory cell. In either case, the deselected row voltage applied during column disturb testing is preferably chosen such that a magnitude of the gate-to-source voltage of the respective pass-gate devices receiving the deselected row voltage is greater than a magnitude of the gate-to-source voltage of a pass-gate device corresponding to an unselected memory cell during normal operation of the memory.

Testing for Weak Cells

Weak memory cells typically leak charge from their respective storage capacitors at a faster rate compared to those memory cells within a certain normal distribution of cells. Because leakage characteristics of weak cells are atypical, they are often referred to as sports. Typically, there may be only a very few sports in a given memory array. It is desirable to discover these sports so that, by methods known in the art (e.g., repair, error correction, etc.), they can be excluded from use in the memory array. Margin testing with an adjusted row voltage, in accordance with an embodiment of the invention, is an appropriate way to discover sports in a time-efficient manner. With reads following normal writes, weak cells may fail only at specific voltages and/or temperatures. It is not practical to test at a large number of voltages and/or temperatures. Margin testing with an adjusted row voltage can exacerbate failures, making them apparent at standard testing voltages and temperatures.

Testing for Weak Columns

Weak columns fail primarily because of imbalances and/or defects in the columns, precharge devices or associated sense amplifiers in a memory array, not due to atypical cell leakage characteristics. Margin testing using adjusted row voltage can reduce the charge stored in the cells so that when shared with columns during a read operation, the charge transferred to the column and its induced column voltage change is less than the effect of the offending imbalance(s). This will result in failure during reading. In this way, weak columns can be efficiently uncovered. With reads following normal writes, weak columns may fail only at specific voltages and/or temperatures. It is not practical to test for weak columns at a large number of voltages and/or temperatures. Hence, as in the case of testing for weak cells, margin testing with adjusted row voltage can exacerbate weak column failures, making them apparent at standard testing voltages and temperatures.

Pass-Gate Device High Threshold Voltage Testing

The magnitude of a transistor threshold voltage, including that of the pass-gate device in a memory cell, increases as temperature decreases. As shown in Table 2, if the write row voltage is at least a threshold voltage magnitude above the column line voltage, the voltage stored for a logic low data state on Node 1 increases as the magnitude of the threshold voltage increases. Thus, the lowest specified operating temperature will correspond to the highest logic low data state voltage level on Node 1. This, in turn, corresponds to the least amount of logic low data state stored charge in the cell storage capacitor and is the state that is closest to failure in terms of cell charge. This failure mechanism only applies to cells written to a logic low data state. The logic high data state charge written into the memory cell is not related to the pass-gate device threshold in the same manner.

In order to avoid testing at the lowest specified operating temperature (e.g., typically minus 40 degrees Celsius) and still uncover pass-gate device logic high threshold failures, ICs can be tested at a higher temperature (e.g., typically 25 degrees Celsius, room temperature) if the voltage applied to a row line corresponding to a selected memory cell is increased by substantially the same amount that the pass-gate device threshold voltage increases when going from the higher temperature (e.g., 25 degrees Celsius) to the lower temperature (e.g., minus 40 degrees Celsius). In this way, substantially the same amount of logic low data state charge will be written into the storage capacitor of the selected memory cell when tested at the higher temperature as would have been written when testing at the lower temperature with an unadjusted row voltage.

Figure 5:
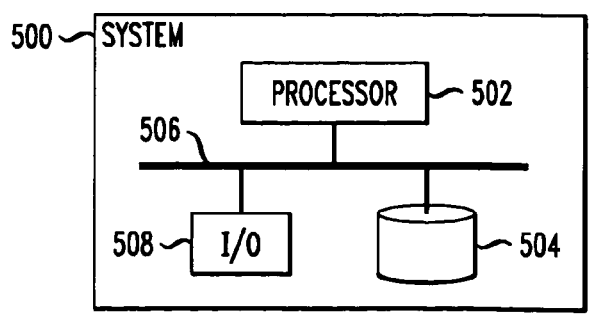
FIG. 5 is a block diagram depicting at least a portion of an exemplary processing system in which techniques of the invention may be employed, formed in accordance with an embodiment of the invention.

The testing methodologies of embodiments of the present invention may be particularly well-suited for implementation in an electronic device or alternative system. For example, FIG. 5 is a block diagram depicting an exemplary processing system 500 formed in accordance with an aspect of the invention. System 500 may represent, for example, ATE (e.g., IC tester, IC wafer prober, chip handler, binning equipment, etc.). System 500 may include a processor 502, memory 504 coupled to the processor (e.g., via a bus 506 or alternative connection means), as well as input/output (I/O) circuitry 508 operative to interface with the processor. The processor 502 may be configured to perform at least a portion of the methodologies of the present invention described herein above.

It is to be appreciated that the term "processor" as used herein is intended to include any processing device, such as, for example, one that includes a central processing unit (CPU) and/or other processing circuitry (e.g., network processor, DSP, microprocessor, etc.). Additionally, it is to be understood that the term "processor" may refer to more than one processing device, and that various elements associated with a processing device may be shared by other processing devices. The term "memory" as used herein is intended to include memory and other computer-readable media associated with a processor or CPU, such as, for example, random access memory (RAM), read only memory (ROM), fixed storage media (e.g., a hard drive), removable storage media (e.g., a diskette), flash memory, etc. Furthermore, the term "I/O circuitry" as used herein is intended to include, for example, one or more input devices (e.g., keyboard, mouse, etc.) for entering data to the processor, one or more output devices (e.g., printer, monitor, etc.) for presenting the results associated with the processor, and/or interface circuitry for operatively coupling the input or output device(s) to the processor.

Accordingly, an application program, or software components thereof, including instructions or code for performing the methodologies of the invention, as described herein, may be stored in one or more of the associated storage media (e.g., ROM, fixed or removable storage) and, when ready to be utilized, loaded in whole or in part (e.g., into RAM) and executed by the processor 502. In any case, it is to be appreciated that at least a portion of the components shown in FIG. 1 may be implemented in various forms of hardware, software, or combinations thereof, e.g., one or more DSPs with associated memory, application-specific integrated circuit(s), functional circuitry, one or more operatively programmed general purpose digital computers with associated memory, etc. Given the teachings of the invention provided herein, one of ordinary skill in the art will be able to contemplate other implementations of the components of the invention.

At least a portion of the methodologies of the present invention may be implemented in otherwise conventional integrated circuit ATE for performing device verification and/or characterization. Manufacturers of conventional ATE include, but are not limited to, Teradyne Inc., Testmetrix Inc., MOSAID Technologies Inc., ALLTEQ Industries Inc., Schlumberger Ltd., Advantest Corp., and in TEST Corp.

At least a portion of the apparatus and methodologies of the present invention may be implemented in one or more integrated circuits. In forming integrated circuits, die are typically fabricated in a repeated pattern on a surface of a semiconductor wafer. Each of the die includes a device described herein, and may include other structures or circuits. Individual die are cut or diced from the wafer, then packaged as integrated circuits. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A method of testing a semiconductor memory device including a plurality of memory cells and a plurality of row lines and column lines connected to the memory cells for selectively accessing one or more of the memory cells, the method comprising the steps of:

applying a first voltage to at least a given one of the row lines, the given row line corresponding to at least a given one of the memory cells to be tested, the first voltage being selected to stress at least one performance characteristic of the given memory cell corresponding to the given row line, the first voltage being different than a second voltage applied to the given row line for accessing the given memory cell during normal operation of the memory device;

exercising the memory device in accordance with prescribed testing parameters; and identifying whether the memory device is operable within prescribed margins of the testing parameters.

2. The method of claim 1, further comprising the step of adjusting the first voltage so as to reduce charge written into the given one of the memory cells to be tested.

3. The method of claim 1, further comprising the step of adjusting the first voltage so as to increase leakage through a pass-gate device corresponding to the given one of the memory cells to be tested.

4. The method of claim 1, further comprising the step of writing a logic low level into the given memory cell to be tested, wherein the at least one performance characteristic comprises pass-gate device high threshold voltage level testing of the given memory cell.

5. The method of claim 1, wherein the at least one performance characteristic comprises at least one of data retention testing and column disturb testing, further comprising the step of adjusting the first voltage applied to the given one of the row lines such that an amount of charge stored in the given memory cell to be tested is reduced compared to an amount of charge stored in the given memory cell during a standard write operation of the memory cell.

6. The method of claim 1, wherein the at least one performance characteristic comprises pass-gate device high threshold voltage level testing, further comprising the steps of:

measuring a difference in threshold voltage of a pass-gate transistor device corresponding to the given memory cell to be tested when the memory cell is at a first temperature and when the memory cell is at a second temperature, the first temperature being indicative of a lowest specified temperature of operation of the memory device and the second temperature being greater than the first temperature; and adjusting the first voltage applied to the given one of the row lines corresponding to the given memory cell as a function of the measured difference in threshold voltage.

7. The method of claim 6, wherein the second temperature is indicative of substantially room temperature.

8. The method of claim 1, wherein the at least one performance characteristic comprises column disturb testing, the method further comprising the step of applying a third voltage to at least one of the row lines not connected to the given one of the memory cells to be tested, the third voltage being selected such that a magnitude of a gate-to-source voltage of a pass-gate device corresponding to a memory cell not being tested is greater than a magnitude of a gate-to-source voltage of a pass-gate device corresponding to an unselected memory cell during normal operation of the memory device.

9. The method of claim 1, wherein the at least one performance characteristic comprises data retention margin testing, further comprising the steps of:

adjusting the first voltage applied to the given one of the row lines such that an amount of charge stored in the given memory cell is reduced compared to an amount of charge stored in the given memory cell during a standard write operation of the memory cell;

storing a voltage in the given memory cell indicative of a logic high state; and after a first period of time after storing the logic high state in the given memory cell, reading the state of the given memory cell to determine whether the voltage stored in the given memory cell is at least equal to a specified minimum level indicative of a logic high state, the first period of time being less than a minimum specified data retention period corresponding to the memory device.

10. The method of claim 9, wherein the first period of time is a function of an amount of reduction in the amount of charge stored in the given memory cell compared to an amount of charge stored in the given memory cell during a standard write operation in the memory device.

11. The method of claim 1, wherein the memory device comprises a dynamic random access memory.

12. A circuit for testing a semiconductor memory device including a plurality of memory cells and a plurality of row lines and column lines connected to the memory cells for selectively accessing one or more of the memory cells, the circuit comprising:
a controller operative to generate an output voltage for activating a given one of the row lines in the memory device, the given row line corresponding to at least a given one of the memory cells to be tested, in a first mode, the controller being operative to selectively adjust a level of the output voltage as a function of at least a first control signal, the level of the output voltage being selected to stress at least one performance characteristic of the given memory cell corresponding to the given row line and, in a second mode, the output voltage being substantially fixed at a prescribed level for accessing the given memory cell during normal operation of the memory device, the level of the output voltage in the first mode being different than the level of the output voltage in the second mode; and
decoding circuitry connected to the controller, the decoding circuitry being operative to receive the output voltage from the controller and to selectively distribute the output voltage to at least the given row line in the memory device as a function of at least a second control signal.

13. The circuit of claim 12, wherein the controller comprises a programmable voltage source operative to generate the output voltage.

14. The circuit of claim 12, wherein the controller comprises a multiplexer operative to receive at least first and second voltages and to generate the output voltage for activating the given one of the row lines in the memory device, the multiplexer selecting the first voltage as the output voltage during the first mode, the multiplexer selecting the second voltage as the output voltage during the second mode, the second voltage being used to activate the given one of the row lines during normal operation of the memory device, the first voltage being different than the second voltage and being used to activate the given one of the row lines during testing of the memory device.

15. The circuit of claim 12, wherein the decoding circuitry comprises switching circuitry having an input for receiving the output voltage from the controller and having a plurality of outputs, each of the outputs connected to a corresponding one of the row lines, the switching circuitry being operative to connect the input to a given one of the outputs as a function of the second control signal.

16. The circuit of claim 12, wherein during the first mode, the controller is operative to adjust the output voltage so as to reduce charge written into the given one of the memory cells to be tested.

17. The circuit of claim 12, wherein during the first mode, the controller is operative to adjust the first voltage so as to increase leakage through a pass-gate device corresponding to the given one of the memory cells to be tested.

18. The circuit of claim 12, wherein the at least one performance characteristic comprises pass-gate device high threshold voltage level testing, and wherein during the first mode, the controller is operative in the first mode: to measure a difference in threshold voltage of a pass-gate transistor device corresponding to the given one of the memory cells to be tested when the given memory cell is at a first temperature and when the given memory cell is at a second temperature, the first temperature being indicative of a lowest specified temperature of operation of the memory device and the second temperature being greater than the first temperature; and to adjust the output voltage applied to the given one of the row lines corresponding to the given memory cell as a function of the measured difference in threshold voltage.

19. The circuit of claim 12, wherein the at least one performance characteristic comprises column disturb testing, and wherein the controller is operative in the first mode to apply a second voltage to at least one of the row lines not connected to the given one of the memory cells to be tested, the second voltage being selected such that a magnitude of a gate-to-source voltage of a pass-gate device corresponding to a memory cell not being tested is greater than a magnitude of a gate-to-source voltage of a pass-gate device corresponding to an unselected memory cell during normal operation of the memory device.

20. The circuit of claim 12, wherein the at least one performance characteristic comprises data retention margin testing, and wherein the controller is operative in the first mode: to adjust the output voltage applied to the given one of the row lines such that an amount of charge stored in the given memory cell corresponding to the given row line is reduced compared to an amount of charge stored in the given memory cell during a standard write operation of the memory cell; to store a voltage in the given memory cell indicative of a logic high state; and, after a first period of time after storing the logic high state in the given memory cell, to read the state of the given memory cell to determine whether the voltage stored in the given memory cell is at least equal to a specified minimum level indicative of a logic high state, the first period of time being less than a minimum specified data retention period corresponding to the memory device.

21. The circuit of claim 12, wherein the first control signal comprises a test mode signal and the second control signal comprises an address signal.

22. An integrated circuit including at least one circuit for testing memory including a plurality of memory cells and a plurality of row lines and column lines connected to the memory cells for selectively accessing one or more of the memory cells, the at least one circuit comprising:
a controller operative to generate an output voltage for activating a given one of the row lines in the memory, the given row line corresponding to at least a given one of the memory cells to be tested, in a first mode, the controller being operative to selectively adjust a level of the output voltage as a function of at least a first control signal, the level of the output voltage being selected to stress at least one performance characteristic of the given memory cell corresponding to the given row line and, in a second mode, the output voltage being substantially fixed at a prescribed level for accessing the given memory cell during normal operation of the memory, the level of the output voltage in the first mode being different than the level of the output voltage in the second mode; and
decoding circuitry connected to the controller, the decoding circuitry being operative to receive the output voltage from the controller and to selectively distribute the output voltage to at least the given row line in the memory device as a function of at least a second control signal.

23. An automated test equipment (ATE) apparatus for detecting one or more failures in a memory device including a plurality of memory cells and a plurality of row lines and column lines connected to the memory cells for selectively accessing one or more of the memory cells, the apparatus comprising:
  a programmable voltage source; and
  at least one processor coupled to the programmable voltage source and operative: (i) to apply a first voltage generated by the programmable voltage source to at least a given one of the row lines, the given row line corresponding to at least a given one of the memory cells to be tested, the first voltage being adjusted to stress at least one performance characteristic of the given memory cell corresponding to the given row line, the first voltage being different than a second voltage applied to the given row line for accessing at least one of the given memory cell during normal operation of the memory device; (ii) to exercise the memory device in accordance with prescribed testing parameters; and (iii) to identify whether the memory device is operable within prescribed margins of the testing parameters.

* * * * *